United States Patent
Nishimura et al.

(10) Patent No.: US 7,920,025 B2
(45) Date of Patent: Apr. 5, 2011

(54) OPERATIONAL AMPLIFIER AND METHOD OF DRIVING LIQUID CRYSTAL DISPLAY

(75) Inventors: Kouichi Nishimura, Kanagawa (JP); Kazuo Suzuki, Tokyo (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 805 days.

(21) Appl. No.: 11/902,169

(22) Filed: Sep. 19, 2007

(65) Prior Publication Data
US 2008/0074405 A1  Mar. 27, 2008

(30) Foreign Application Priority Data
Sep. 21, 2006 (JP) .................. 2006/255655

(51) Int. Cl.
H03F 3/45 (2006.01)
(52) U.S. Cl. .............................. 330/255; 330/9; 330/267
(58) Field of Classification Search .................. 330/253, 330/255, 267, 9; 345/98, 100, 212
See application file for complete search history.

(56) References Cited

U.S. PATENT DOCUMENTS

| 7,408,402 B2* | 8/2008 | Nishimura ........................ 330/9 |
| 7,443,239 B2* | 10/2008 | Tsuchi et al. .................. 330/253 |
| 7,573,333 B2* | 8/2009 | Yokota .......................... 330/255 |

FOREIGN PATENT DOCUMENTS

| JP | 6-326529 | 11/1994 |
| JP | 11-249623 | 9/1999 |

* cited by examiner

Primary Examiner — Khanh V Nguyen
(74) Attorney, Agent, or Firm — McGinn IP Law Group, PLLC

(57) ABSTRACT

It was difficult to design an operational amplifier which can cancel an offset to drive a liquid crystal display. An operational amplifier includes: a first differential pair having a first transistor and a second transistor of a first conduction type; a second differential pair having a third transistor and a fourth transistor of a second conduction type; a first floating current source; a second floating current source; and an output stage having a fifth transistor and a sixth transistor, in which, when an input signal is applied to the first and third transistor, an electric current which flows into the fifth transistor and the sixth transistor is set by the first floating current source, and when the input signal is applied to the second and fourth transistor, an electric current which flows into the fifth transistor and the sixth transistor is set by the second floating current source.

9 Claims, 7 Drawing Sheets

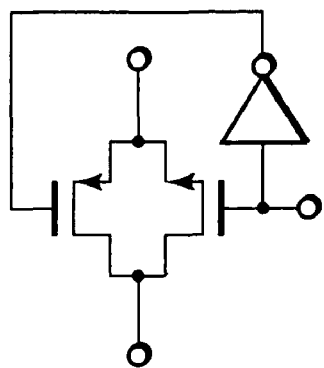
FIG. 4A  FIG. 4B  FIG. 4C  FIG. 4D
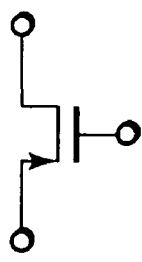
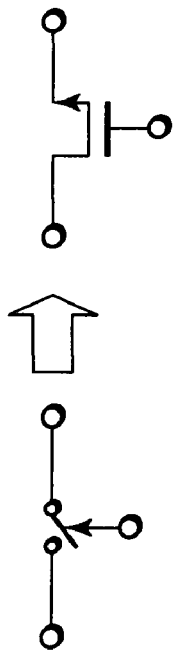
FIG. 4E  FIG. 4F  FIG. 4G  FIG. 4H
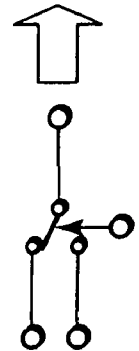
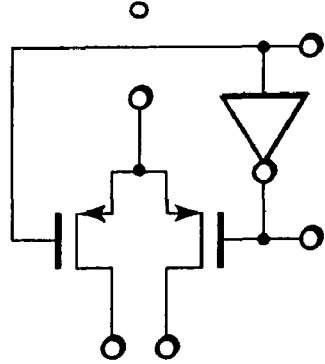
or
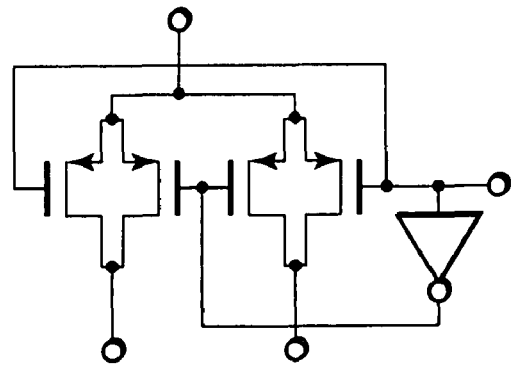
or

US 7,920,025 B2

OPERATIONAL AMPLIFIER AND METHOD OF DRIVING LIQUID CRYSTAL DISPLAY

BACKGROUND OF THE INVENTION

1. Field of the Invention

The present invention relates to an operational amplifier and a method of driving a liquid crystal display using the operational amplifier.

2. Description of the Related Art

Recently, a liquid crystal display has been generally used for a device for displaying image. Therefore, various driving methods and driving circuits for driving a liquid crystal display have been proposed. An operational amplifier is widely known as an amplifier used for the driving circuits of the liquid crystal display. One example of such operational amplifier is disclosed in Japanese Patent Application Laid-Open No. 6-326529. FIG. 5 shows the operational amplifier disclosed in Japanese Patent Application Laid-Open No. 6-326529. As shown in FIG. 5, this operational amplifier includes a differential input stage 51, an intermediate stage 52 and an output stage 53.

The input stage 51 described in Japanese Patent Application Laid-Open No. 6-326529 includes a differential pair composed of NMOS transistors MN51, MN52 and a differential pair composed of PMOS transistors MP51, MP52. To each of the differential pairs, the same signal is applied. In the input stage 51, in the range in which the differential pair of the PMOS transistors does not operate, the differential pair of the NMOS transistors operates. On the contrary, in the range in which the differential pair of the NMOS transistors does not operate, the differential pair of the PMOS transistors operates. According to such configuration, the input stage 51 which operates in the entire range of a supply voltage can be provided.

According to the technology disclosed in Japanese Patent Application Laid-Open No. 6-326529, by summing an output from each of the differential pairs of the input stage 51 in a form of electric current in the intermediate stage 52, an output as an operational amplifier is supplied from the output stage 53.

On the one hand, an operational amplifier has a problem that an offset intrinsic to the operational amplifier is generated. Then, it is known that the problem of the offset is solved using an operational amplifier as shown in Japanese Patent Application Laid-Open No. 11-249623, when driving a liquid crystal display. FIGS. 6A, 6B show the technology described in Japanese Patent Application Laid-Open No. 11-249623. When a liquid crystal display is driven by an operational amplifier, it is generally driven by inverting polarity to be positive or negative relative to a predetermined voltage (a common voltage). Then, according to the technology described in Japanese Patent Application Laid-Open No. 11-249623, a switch is changed for each frame to be displayed, as shown in FIGS. 2A, 2B. An offset voltage +Vos generated in a state of FIG. 6A and an offset voltage −Vos generated in a state of FIG. 6B are dispersed by driving a liquid crystal display while changing an inverting input-terminal, a noninverting input terminal and an output terminal. According to such driving way, a display image can be visually recognized as if the offset is not present.

SUMMARY OF THE INVENTION

However, in the circuit disclosed in Japanese Patent Application Laid-Open No. 6-326529, it was not enabled to cancel the offset voltage only by changing the input terminal and the output terminal as shown in Japanese Patent Application Laid-Open No. 11-249623. In order to solve the problem of the offset voltage caused in the circuit which operates in the entire range of a supply voltage as shown in Japanese Patent Application Laid-Open No. 6-326529, a complex circuit configuration becomes necessary, which was a factor for making a problem such as an increase in circuit area.

An operational amplifier according to one aspect of the present invention includes: a first differential pair having a first transistor and a second transistor of a first conduction type; a second differential pair having a third transistor and a fourth transistor of a second conduction type; a first floating current source; a second floating current source; and an output stage having a fifth transistor and a sixth transistor, in which, when an input signal is applied to the first and third transistor, an electric current which flows into the fifth transistor and the sixth transistor is set by the first floating current source, and when the input signal is applied to the second and fourth transistor; an electric current which flows into the fifth transistor and the sixth transistor is set by the second floating current source.

According to the operational amplifier of the present invention, when a liquid crystal display etc. is driven, an offset in vision can be cancelled to drive.

BRIEF DESCRIPTION OF THE DRAWINGS

FIG. 4A to 4H is a view illustrating a switch according to the present embodiment of the present invention;

DETAILED DESCRIPTION OF THE PREFERRED EMBODIMENTS

Figure 1:
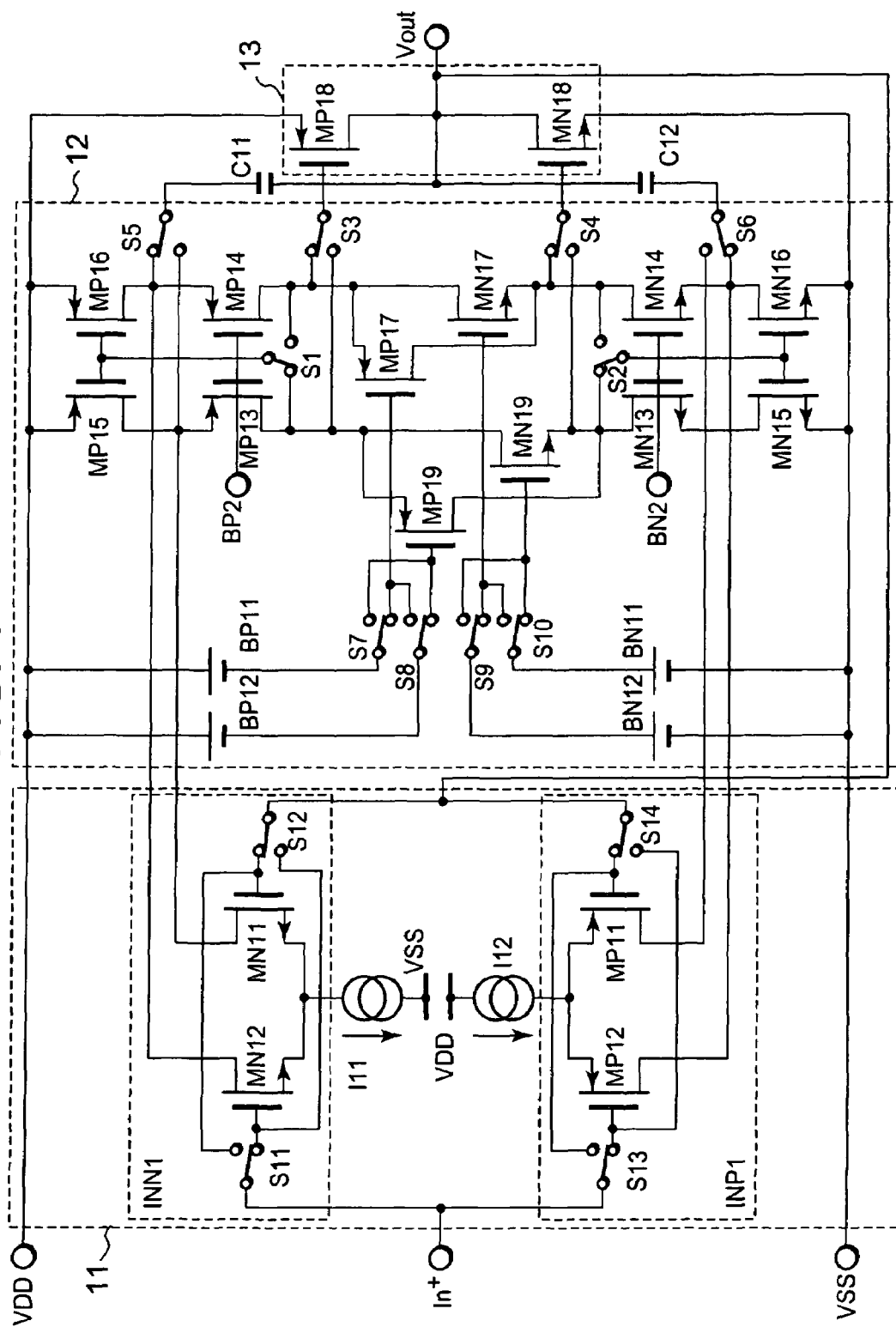
FIG. 1 is a circuit diagram illustrating an operational amplifier of a first embodiment of the present invention.

Now, a first embodiment of the present invention will be hereinafter described with reference to the accompanying drawings. FIG. 1 is a circuit diagram illustrating an operational amplifier of the first embodiment of the present invention. The operational amplifier of the present embodiment includes an input stage 11, an intermediate stage 12 and an output stage 13.

The input stage 11 includes an N channel differential pair INN1 composed of an N channel transistor, a P channel differential pair INP1 composed of a P channel transistor, and constant current sources I11, I12. The N channel differential pair INN1 includes N channel MOS transistors MM11 and MN12. The P channel differential pair INP1 includes P channel MOS transistors MP11 and MP12.

The intermediate stage 12 includes P channel MOS transistors MP13 to MP16, and N channel MOS transistors MN13 to MN16. The intermediate stage 12 of the present embodiment includes P channel MOS transistors MP17, MP19, and N channel MOS transistors MN17, MN19 for being associated with current determination of the output stage 13.

The output stage 13 includes an N channel MOS transistor MN18 and a P channel MOS transistor MP18 for constituting an output buffer amplifier.

Further, the operational amplifier of the present embodiment includes switches S1 to S14, and phase compensation capacitors C11, C12. In the following description, "make type switch" is a switch which is closed (make state) when a control signal is applied. Further, "break type switch" is a switch which is opened (break state) when a control signal is applied. Then, "transfer type switch" is a switch which has a common terminal and two output terminals (the make side and the break side) and in which the common terminal is brought into connection with the make side when a control signal is applied, and the common terminal is brought into connection with the break side when the control signal is not applied. The switches S1 to S14 above are the transfer type switches.

The N channel MOS transistors MN11, MN12 of the differential pair INN1 are connected to a noninverting input terminal In+ and an inverting input terminal. In addition, the inverting input terminal is connected to an output terminal Vout so that a voltage at the output terminal is fed back. The P channel MOS transistors MP11, MP12 constituting the differential pair INP1 are connected to the noninverting input terminal In+ and the inverting input terminal.

The switch S1 changes connection of gates of the P channel MOS transistors MP15, MP16 commonly connected to each other, to one of drains of the P channel MOS transistors MP13, MP14. Here, the side of a common terminal of the switch S1 is connected to the gates of the P channel MOS transistors MP15, MP16 commonly connected, a break terminal is connected to the drain of the P channel MOS transistor MP13, and a make terminal is connected to the drain of the P channel MOS transistor MP14.

The switch S2 changes connection of gates of the N channel MOS transistors MN15, MN16 commonly connected to each other, to one of drains of the N channel MOS transistors MN13, MN14. Here, the side of a common terminal of the switch S2 is connected to the gates of the N channel MOS transistors MN15, MN16 commonly connected, a break terminal is connected to the drain of the N channel MOS transistor MN13, and a make terminal is connected to the drain of the N channel MOS transistor MN14.

The P channel MOS transistors MP15, MP16 have their sources commonly connected to each other. The sources of the P channel MOS transistors MP15, MP16 are connected to a positive power source VDD (power source having a higher potential). The P channel MOS transistors MP15, MP16 function as an active load, which are connected in folded cascode.

The N channel MOS transistors MN15, MN16 also have their sources commonly connected to each other. The sources of the N channel MOS transistors MN15, MN16 are connected to a negative power source VSS (power source having a lower potential). The N channel MOS transistors MN15, MN16 function as an active load, which are connected in folded cascode.

The P channel MOS transistors MP13, MP14 have their gates commonly connected to each other and to a bias terminal BP2. Each source of the P channel MOS transistors MP13, MP14 is connected to each drain of the P channel MOS transistors MP15, MP16, respectively.

The N channel MOS transistors MN13, MN14 have their gates commonly connected to each other and to a bias terminal BN2. Each source of the N channel MOS transistors MN13, MN14 is connected to each drain of the N channel MOS transistors MN15, MN16, respectively.

The switch S3 changes connection of a gate of the P channel MOS transistor MP18 for constituting the output stage, to one of the drains of the P channel MOS transistors MP13, MP14. Here, the side of a common terminal of the switch S3 is connected to the gate of the P channel MOS transistor MP18, a break terminal is connected to the drain of the P channel MOS transistor MP14, and a make terminal is connected to the drain of the P channel MOS transistor MP13.

The switch S4 changes connection of a gate of the N channel MOS transistor MN18 for constituting the output stage, to one of the drains of the N channel MOS transistors MN13, MN14. Here, the side of a common terminal of the switch S4 is connected to the gate of the N channel MOS transistor MN18, a break terminal is connected to the drain of the N channel MOS transistor MN14, and a make terminal is connected to the drain of the N channel MOS transistor MN13.

The switch S5 changes connection of one end of the phase compensation capacitor C11, to one of drains of the P channel MOS transistors MP15, MP16. Here, the side of a common terminal of the switch S5 is connected to the one end of the phase compensation capacitor C11, a break terminal is connected to the drain of the P channel MOS transistor MP16, and a make terminal is connected to the drain of the P channel MOS transistor MP15.

The switch S6 changes connection of one end of the phase compensation capacitor C12, to one of drains of the N channel MOS transistors MN15, MN16. Here, the side of a common terminal of the switch S6 is connected to the one end of the phase compensation capacitor C12, a break terminal is connected to the drain of the N channel MOS transistor MN16, and a make terminal is connected to the drain of the N channel MOS transistor MN15.

The switch S7 changes connection of a constant voltage source BP11, to one of gates of the P channel MOS transistors MP17, MP19. Here, the side of a common terminal of the switch S7 is connected to the constant voltage source BP11, a break terminal is connected to the gate of the P channel MOS transistor MP17, and a make terminal is connected to the gate of the P channel MOS transistor MP19.

The switch S8 changes connection of a constant voltage source BP12, to one of the gates of the P channel MOS transistors MP19, MP17. Here, the side of a common terminal of the switch S8 is connected to the constant voltage source BP12, a break terminal is connected to the gate of the P channel MOS transistor MP19, and a make terminal is connected to the gate of the P channel MOS transistor MP17.

The switch S9 changes connection of a constant voltage source BN12, to one of the gates of the N channel MOS transistors MN17, MN19. Here, the side of a common terminal of the switch S9 is connected to the constant voltage source BN11, a break terminal is connected to the gate of the N channel MOS transistor MN17, and a make terminal is connected to the gate of the N channel MOS transistor MN19.

The switch S10 changes connection of a constant voltage source BN11, to one of the gates of the N channel MOS transistors MN19, MN17. Here, the side of a common terminal of the switch S10 is connected to the constant voltage source BN12, a break terminal is connected to the gate of the N channel MOS transistor MN19, and a make terminal is connected to the gate of the N channel MOS transistor MP17.

A source of the P channel MOS transistor MP19 is commonly connected to a drain of the N channel MOS transistor MN19 and connected to a drain of the P channel MOS transistor MP13. Further, a drain of the P channel MOS transistor MP19 is commonly connected to a source of the N channel MOS transistor MN19 and connected to a drain of the N channel MOS transistor MN13.

A source of the P channel MOS transistor MP17 is commonly connected to a drain of the N channel MOS transistor MN17 and connected to a drain of the P channel MOS transistor MP14. Further, a drain of the P channel MOS transistor MP17 is commonly connected to a source of the N channel MOS transistor MN17 and connected to a drain of the N channel MOS transistor MN14.

The switch S11 has its common terminal connected to the input terminal In+. A make terminal of the switch S11 is connected to a gate of the N channel MOS transistor MN11, and a break terminal is connected to a gate of the N channel MOS transistor MN12, respectively.

The switch S12 has its common terminal connected to the output terminal Vout. A break terminal of the switch S12 is connected to the gate of the N, channel MOS transistor MN11, and a make terminal is connected to the gate of the N channel MOS transistor MN12. That is, the switch S11 changes the noninverting input signal of the N channel differential pair, and the switch S12 changes the inverting input signal of the N channel differential pair.

The switch 13 has its common terminal connected to the input terminal In+. A make terminal of the switch S13 is connected to a gate of the P channel MOS transistor MP11, and a break terminal is connected to a gate of the P channel MOS transistor MP12. The switch S14 has its common terminal connected to the output terminal Vout.

A break terminal of the switch S14 is connected to the gate of the P channel MOS transistor MP11, and a make terminal is connected to the gate of the P channel MOS transistor MP12. That is, the switch S13 changes the noninverting input signal of the P channel differential pair, and the switch S14 changes the inverting input signal of the P channel differential pair.

The constant current source I11 is connected between sources of the N channel MOS transistors MN11, MN12 commonly connected to each other and the negative power source VSS. The constant current source I12 is connected between sources of the P channel MOS transistors MP11, MP12 commonly connected to each other and the positive power source VDD.

A source of the P channel MOS transistor MP18, an output transistor, is connected to the positive power source VDD, and a source of the N channel MOS transistor MN18 is connected to the negative power source VSS. Further, the output terminal Vout is formed by commonly connecting among a drain of the P channel MOS transistor MP18, a drain of the N channel MOS transistor MN18, the other end of the phase compensation capacitor C11 and the other end of the phase compensation capacitor C12.

Operation of the present embodiment configured in such a way will be hereinafter described. In the circuit of FIG. 1, the switches S1 to S14 all operate in conjunction with one another. The switches S1 to S14 are brought into one of the break state in that all switches are opened, and the make state in that all switches are closed.

The switch S1 can change an offset voltage caused from unevenness in threshold voltage (Vt) of the active load composed of the P channel MOS transistors MP15 and MP16. Similarly, the switch S2 can change an offset voltage caused from unevenness in threshold voltage (Vt) of the active load composed of the N channel MOS transistors MN15 and MN16.

Further, the switches S11, S12 can change an offset voltage caused from unevenness in threshold voltage (Vt) of the transistors MN11 and MN12 of the N channel differential pair.

Similarly, the switches S13, S14 can change an offset voltage caused from unevenness in threshold voltage (Vt) of the transistors MP11 and MP12 of the P channel differential pair.

In the circuit configuration of FIG. 1, most of the offset voltage of the amplifier is determined by four factors for causing unevenness. The four factors of unevenness are unevenness in the threshold voltage (Vt) of the active load composed of the P channel MOS transistors MP15, MP16, unevenness in the threshold voltage (Vt) of the active load composed of the N channel MOS transistors MN15, MN16, unevenness in the threshold voltage (Vt) of the N channel MOS transistors MN11, MN12 of the N channel differential pair, and unevenness in the threshold voltage (Vt) of the P channel MOS transistors MP11, MP12 of the P channel differential pair.

Therefore, the offset voltage caused from the four factors arises to be opposite in polarity to an ideal voltage, respectively, by changing the switches S1, S2 and S11 to S14 as described above. Let Vos be the offset voltage caused from the four factors, and let VIN be the input voltage, then the output voltage VO may be as follows, every time the switches are changed:

$$VO = VIN \pm Vos \qquad (1)$$

Where, the polarity designated by "±" becomes, depending on the two states of the switches, "+" in one of the states of the switches, and "−" in the other of the states of the switches. That is, if VO=VIN+Vos when the switches S1 to S14 are opened (break state), then VO=VIN−Vos when the switches S1 to S14 are closed (make state). Therefore, if VO=VIN−Vos when the switches S1 to S14 are opened (break state), then VO=VIN+Vos when the switches S1 to S14 are closed (make state). That is, the polarity is varied depending on the offset voltage which the amplifier originally has.

By the way, with only changing the switches S1, S2, and S11 to S14 simply, the operational amplifier will not operate normally. Changing the switches needs to change another circuit connection. For one thing, because changing the switches S1, S2 involves change of the input and output connection of the active load, it becomes necessary to change connection to the next stage. The switches S3, S4 conduct this change. Then, here, an idle current of the output transistors MP18, MN18 presents a problem. That is, when the switches S3, S4 are changed, a gate potential of the output transistors MP18, MN18 is varied, and as the result the idle current is varied. To prevent this, two circuits of bias voltages for each of the differential pairs, BP11, BP12 and BN11, BN12 are provided, and these circuits are selected by the switches S7 to S10. Accordingly, even if the switches S1, S2 are changed, the idle current of the output transistor can be prevented from varying. Further, to correspond to varied polarity of a node to which the phase compensation capacitors C11, C12 are connected, switching also becomes necessary. For this purpose, the switches S5, S6 function.

Similarly, also to prevent variation of an idle current in the intermediate stage (each of drain currents of MP13 to MP16, and MN13 to MN16), the two circuits of the bias voltages for each of the differential pairs, BP11, BP12, and BN11, BN12 are selected by the switches S7 to S10.

By operating the switches as described above, even if the input is varied by changing the switches, the polarity of the offset voltage can be changed as shown in the expression (1) without variation in bias state as the amplifier.

Now, bias current design of the amplifier will be described. The N channel MOS transistor MN19 and the P channel MOS transistor MP19, and the N channel MOS transistor MN17 and the P channel MOS transistor MP17 shown in FIG. 1 function as a floating constant current source, and operate as follows.

First, an idle current in the intermediate stage 12 is analyzed using the floating current source. In the circuit configuration of the intermediate stage 12, a value of the floating current source is derived in a way described below. A voltage V (BP12) of the constant voltage source BP12 is equal to the sum of each gate and each source of the P channel MOS transistor MP15 and the P channel MOS transistor MP19. Let $V_{GS}$ (MP15) and $V_{GS}$ (MP19) be the voltages between the gates and sources, respectively, then obtained:

$$V(BP12)=V_{GS}(MP15)+V_{GS}(MP19) \qquad (2)$$

The voltage between the gate and the source in this expression (2) may be expressed as follows:

$$V_{GS}=(2I_D/\beta)^{1/2}+Vt \qquad (3)$$

Here, $\beta=(W/L)\cdot\mu\cdot C_o$, where, W is a gate width, L is a gate length, μ is mobility, $C_o$ is capacitance of gate oxide file per unit area, Vt is a threshold, and ID is a drain current.

When the differential pair transistors MN11, MN12 operate as an amplifier, their drain currents are equal to each other. Therefore, each drain current is I11/2. A drain current of the P channel MOS transistor MP15 flows with having the sum of a current in the differential stage and a drain current of the P channel MOS transistor MP13. Generally, to make drain currents of MP19 and MN19 constituting the floating current source equal to each other, the bias voltages of BP11, BP12, BN11 and BN12 are determined. Therefore, the drain current Iidle (MP13) of the P channel MOS transistor MP13 forming the idle current in the intermediate stage may be expressed as follows:

[Formula 1]

$$V_{(BP12)} = \sqrt{\frac{2(I_{11/2} + I_{idle\,(MP13)})}{\beta_{(MP15)}}} + \sqrt{\frac{2I_{D\,(MP19)}}{\beta_{(MP19)}}} + 2Vt \qquad (4)$$

$(\beta_{(MP15)}:\beta$ of MP15, $\beta_{(MP19)}:\beta$ of MP19)

$$I_{D(MP19)} = \frac{1}{2}I_{idle\,(MP13)}$$

Here, a detailed circuit of V (BP12) will not be shown, but the expression above can be solved to obtain Iidle (MP13). Because an actual expression takes a very complex form, it will be here omitted.

Similarly, a voltage V (BN12) of the constant voltage source BN12 is set so that each drain current of the N channel MOS transistor MN19 and the P channel MOS transistor MP19 is equal to each other. In such a manner, the floating constant current sources in the intermediate stage are set.

Here, the constant voltage sources BN12, BP12 are improved in strength against variation due to unevenness in element by a configuration using two MOS transistors and a constant current source. It is because the expression V (BP12) of the left-hand side of the expression (4) above has the same term "2Vt" as the expression of the right-hand side, so that this term is eliminated from the left-hand and right-hand side. (A specific example of a circuit is not shown.)

In a similar manner, an idle current in the final stage (the idle current of the P channel MOS transistor MP18 and the N channel MOS transistor MN18 in the output stage) can be determined by BP11 and BN11.

As described above, accordingly to the present embodiment, by setting two types of the bias voltage supplied to the floating current source and switching between the break-state and the make-state of the switches S1 to S14 to operate, it is enabled to display a frame on a liquid crystal display while the polarity of the offset voltage being inverted. Therefore, a display image in which the offset voltage does not occur visually can be displayed.

Embodiment 2

Figure 2:
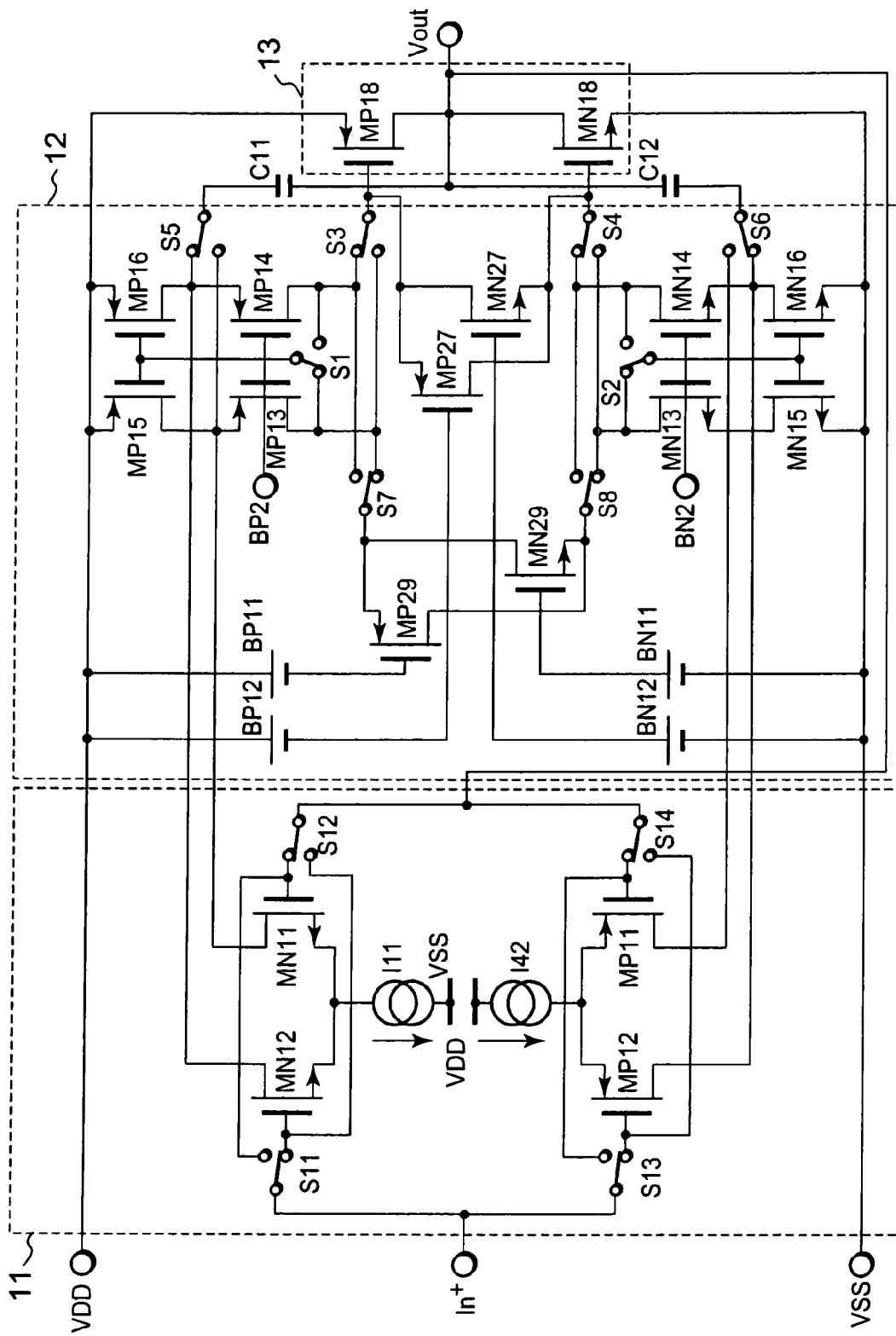
FIG. 2 is a circuit diagram illustrating an operational amplifier of a second embodiment of the present invention.

FIG. 2 is a circuit diagram illustrating an operational amplifier of a second embodiment of the present invention. Like portions in FIG. 2 to the portions described in FIG. 1 are designated by like symbols and their description will be omitted. The circuit diagram shown in FIG. 2 illustrates an example in which a switch is eliminated from the circuit shown in FIG. 1.

Referring to FIG. 2, a node at which a source of a P channel MOS transistor MP27 and a drain of an N channel MOS transistor MN27 are commonly connected to each other is disconnected from the drain of the P channel MOS transistor MP14 shown in FIG. 1 and connected to a common terminal of a switch S3. Further, a node at which a drain of the P channel MOS transistor MP27 and a source of the N channel MOS transistor MN27 are commonly connected to each other is disconnected from the drain of the N channel MOS transistor MN14 shown in FIG. 1 and connected to a common terminal of a switch S4. Due to this connection, a constant voltage source BP12 can be fixedly connected to a gate of the P channel MOS transistor MP27, and a constant voltage source BN12 can be fixedly connected to a gate of the N channel MOS transistor MN27.

Similarly, a node at which a source of a P channel MOS transistor MP29 and a drain of an N channel MOS transistor MN29 are commonly connected to each other is disconnected from the drain of the P channel MOS transistor MP13 shown in FIG. 1 and connected to a common terminal of a switch S7. Further, a node at which a drain of the P channel MOS transistor MP29 and a source of the N channel MOS transistor MN29 are commonly connected to each other is disconnected from the drain of the N channel MOS transistor MN13 shown in FIG. 1 and connected to a common terminal of a switch S8. Due to this connection, a constant voltage source BP11 can be fixedly connected to a gate of the P channel MOS transistor MP29, and a constant voltage source BN11 can be fixedly connected to a gate of the N channel MOS transistor MN29.

In addition, in the present embodiment, a bias circuit constituting BP11, BP12, BN11 and BN12 is characterized by including a switch which is always on. (Not Shown.)

The present embodiment of FIG. 2 is resourcefully made to reduce the number of switches in the circuit configuration shown in FIG. 1. That is, the number of transfer-type switches can be reduced from fourteen by two, by changing a few switching locations, which allows for a configuration using the twelve transfer-type switches in total. In addition, in the present embodiment, in the switches, the bias current flows. Therefore, to reduce an effect caused by this, the bias circuit constituting BP11, BP12, BN11 and BN12 is made to have the bias current stabilized by inserting the always-on switch. As described above, because of all being similar to the first embodiment except the locations into which switches are inserted, basic operation is also the same as the first embodiment. Therefore, description of detailed operation thereof will be omitted.

Embodiment 3

Figure 3:
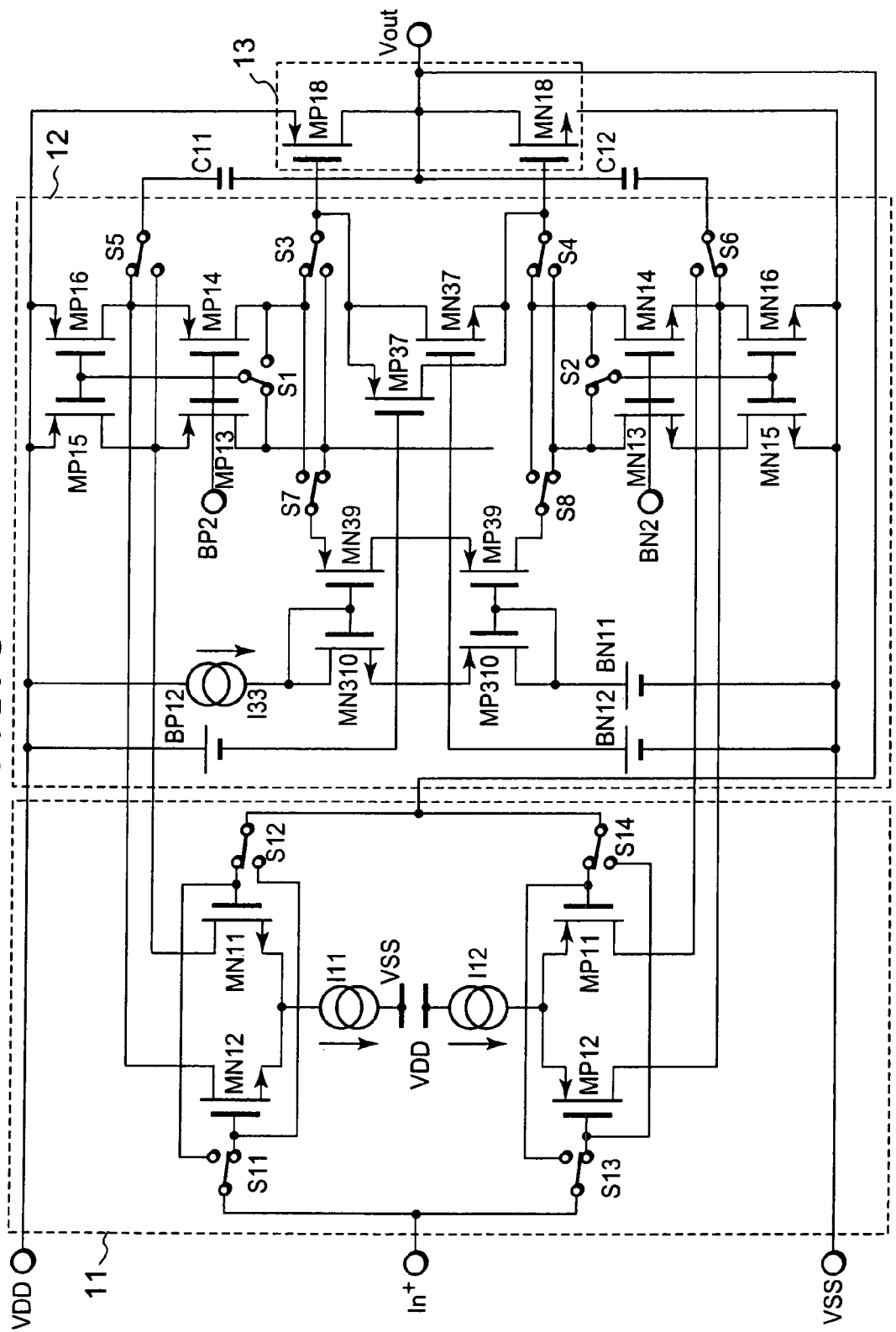
FIG. 3 is a circuit diagram illustrating an operational amplifier of a third embodiment of the present invention.
Figure 5:
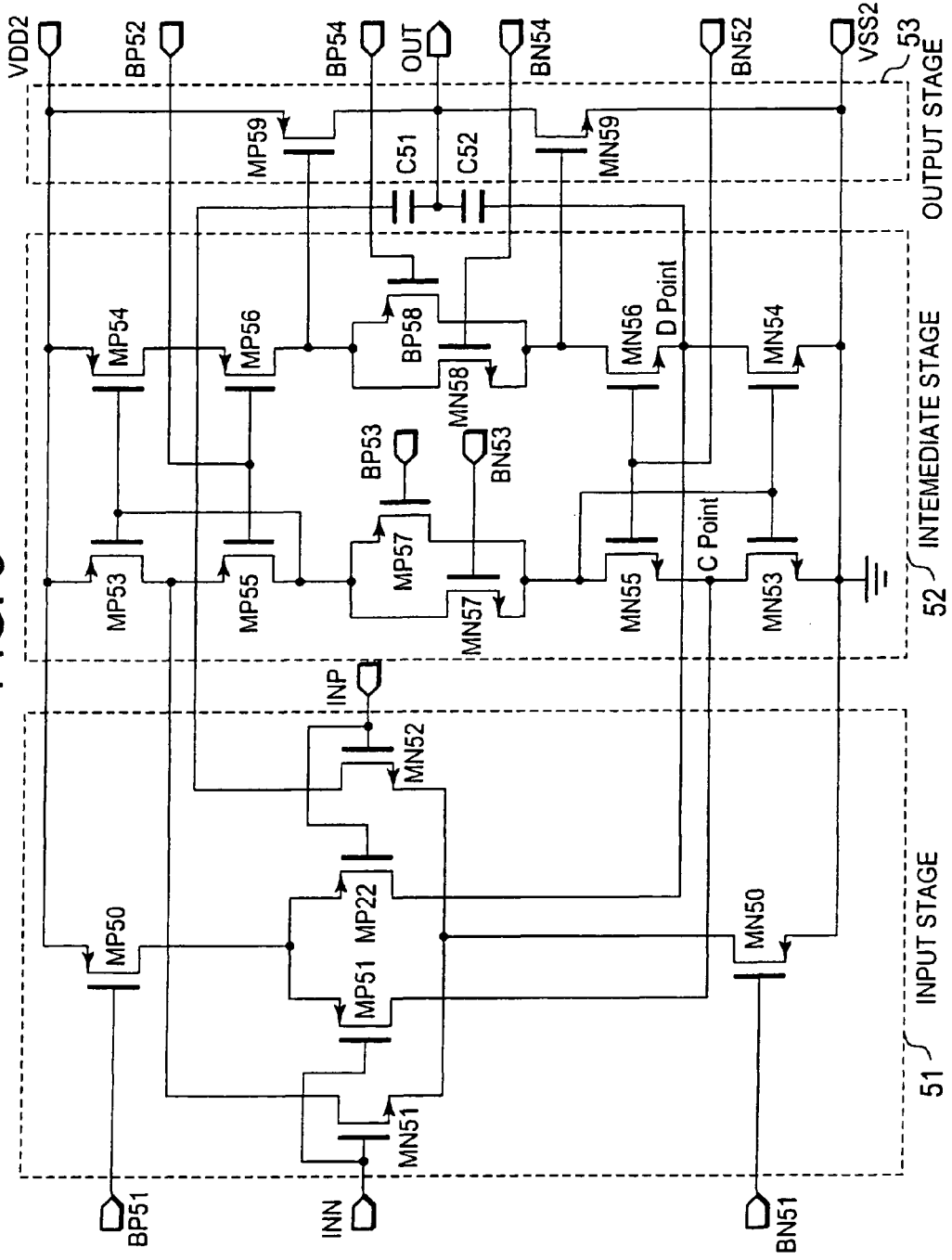
FIG. 5 is a circuit diagram illustrating a conventional operational amplifier.
Figure 6:
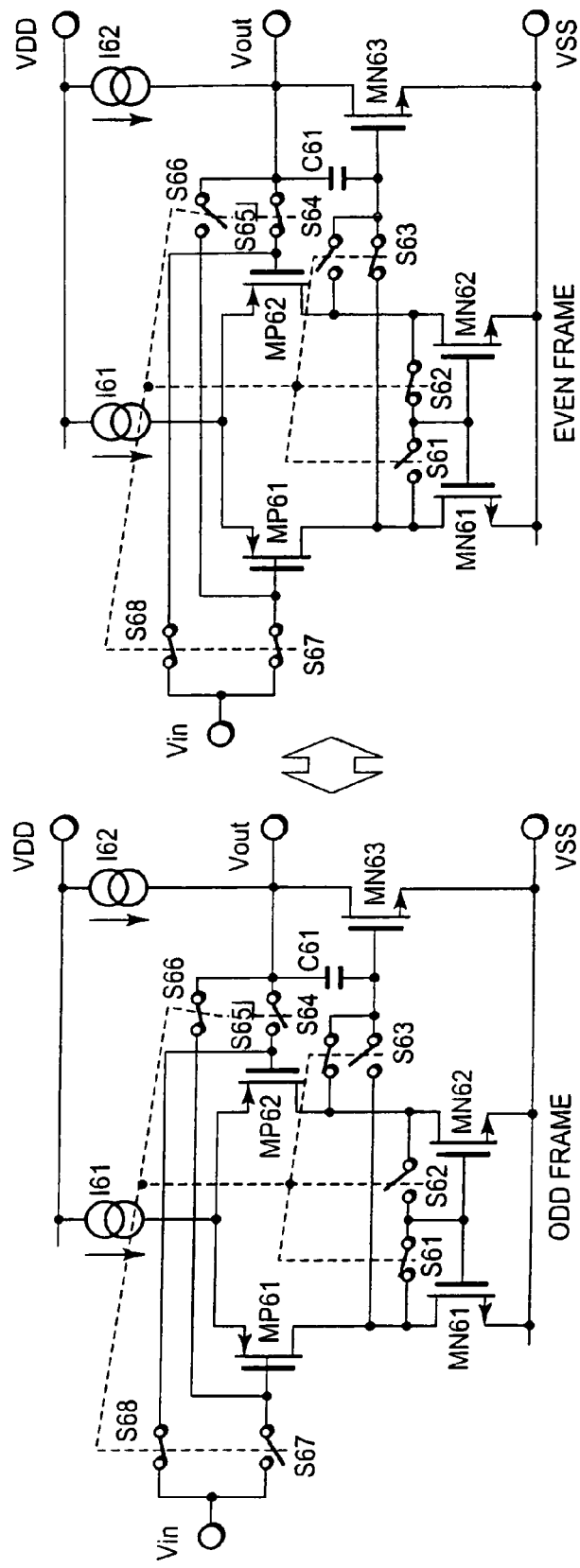
FIG. 6A to 6B is a circuit diagram illustrating a conventional operational amplifier.

FIG. 3 is a circuit diagram illustrating an operational amplifier of a third embodiment of the present invention. In the third embodiment, the P channel MOS transistor MP29 and the N channel MOS transistor MN29 supplying the floating current in the intermediate stage in FIG. 2 are changed in connection to configure a floating current source of another type.

Referring to FIG. 3, the floating current source in the present embodiment includes: N channel MOS transistors MN39, MN310 whose gates are commonly connected to each other; P channel MOS transistors MP39, MP310 whose gates are commonly connected to each other; a constant voltage source BN11 whose positive side is commonly connected to the gate and a drain of the P channel MOS transistor MP310 and whose negative side is connected to a GND potential; and a constant current source I33 one end of which is connected to a positive power terminal VDD and the other end of which is commonly connected to the gate and a drain of the N channel MOS transistor MN310.

A source of the N channel MOS transistor MN310 and a source of the P channel MOS transistor MP310 are commonly connected to each other, a source of the N channel MOS transistor MN39 and a source of the P channel MOS transistor MP39 are commonly connected to each other, and accordingly both terminals of the floating current source are formed of a drain of an N channel MOS transistor MN59 and a drain of a P channel MOS transistor MP39, respectively. With this floating current source, the floating current source composed of the P channel MOS transistor MP29, the N channel MOS transistor MN29 and the constant voltage sources BN11, BP11 shown in FIG. 2 is replaced. The connection conditions except this are the same as those of FIG. 2, and their description will be omitted. In addition, in the present embodiment, the bias circuit constituting BP12, BN12 is characterized by including an always-on switch. (Not shown.)

In a MOS transistor, a drain current is fundamentally equal to a source current. Therefore, the N channel MOS transistor MN310 and the P channel MOS transistor MP310 connected in series operate at the same drain current, respectively. That is, the constant current source 133 supplies each drain current. Similarly, each drain current of the N channel MOS transistor MN39 and the P channel MOS transistor MP39 connected in series is equal to each other.

By the way, the constant voltage source BN11 is most preferably determined so that, at the bias voltage for determining an operating voltage of the P channel MOS transistor MP310 and the N channel MOS transistor MN310, a source potential of the P channel MOS transistor MP310 becomes just VDD/2.

Now, the N channel MOS transistor MN39 and the N channel MOS transistor MN310 are configured to have the same dimension of W/L, where L is a gate length and W is a gate width. Further, the P channel MOS transistor MP310 and the P channel MOS transistor MP39 are made to have the same dimension of W/L. The sum of a voltage $V_{GS\ (MP310)}$ applied between the gate and the source of the P channel MOS transistor MP310 and a voltage $V_{GS\ (MN310)}$ applied between the gate and the source of the N channel MOS transistor MN310 is equal to the sum of a voltage $V_{GS\ (MP39)}$ applied between the source and the gate of the P channel MOS transistor MP59 and a voltage $V_{GS\ (MN39)}$ applied between the gate and the source of the N channel MOS transistor MN39. It is expressed by an expression:

$$V_{GS(MP310)}+V_{GS(MN310)}=V_{GS(MP39)}+V_{GS(MN39)} \qquad (5)$$

Then, the voltage between the gate and the source may be expressed by the expression (2) as described above:

[Formula 2]

$$\sqrt{\frac{2 \cdot I33}{\beta_{(MN310)}}} + \sqrt{\frac{2 \cdot I33}{\beta_{(MP310)}}} = \sqrt{\frac{2I_{D(MN39)}}{\beta_{(MN39)}}} + \sqrt{\frac{2I_{D(MP39)}}{\beta_{(MP39)}}} \qquad (6)$$

(Where, $\beta_{(MXN)}$ shows $$\frac{W}{L}\mu C_o$$

of the $N^{th}$ transistor, respectively.)

Then, a drain current $I_{D(MN39)}$ of the N channel MOS transistor MN39 is equal to a drain current $I_{D(MP39)}$ Of the P channel MOS transistor MN59, and as the result, as follows:

$$I_{D(MN39)}+I_{D(MP39)}=I33$$

Therefore, the floating constant current source can be implemented.

In addition, also in the present embodiment, into the switches, the bias current flows. Then, to lower an effect caused by this, an always-on switch is inserted in the bias circuit constituting BP12, BN12 to stabilize the bias current.

Concerning the switches described in the present embodiments described above, FIG. 4 illustrates a specific example which can implement the switch using an actual electronic circuit. As shown in FIGS. 4A, 4B and 4C, both ends of a make-type switch correspond to a drain and a source of an N channel MOS transistor or a P channel MOS transistor, respectively. Then, on/off control of the switch is made by a gate. Now, when the N channel MOS transistor is used, the switch is closed at a high level of the gate and the switch is turned off at a low level of the gate. When the P channel MOS transistor is used, on the contrary, the switch is closed at the low level of the gate and the switch is turned off at the high level of the gate. FIG. 4D shows a switch of type in that each drain and each source of an N channel and a P channel in a circuit containing a combination of the N channel and the P channel are commonly connected to each other, respectively, and each gate is driven by a signal having a phase opposite to each other using an inverter. In this case, when the gate of the N channel MOS transistor is at the high level and the gate of the P channel MOS transistor is made to be the low level by the inverter, both of them are turned on. That is, the switch is turned on. On the contrary, when the gate of the N channel MOS transistor is at the low level and the gate of the P channel MOS transistor is made to be the high level by the inverter, both of them are turned off. That is, the switch is turned off.

Further, in the case of a transfer-type switch shown in FIG. 4F, sources of two N channel MOS transistors are made common as a common terminal of the transfer switch and drains of the two N channel MOS transistors form a make/break terminal, respectively. Then, each gate is driven by an opposite phase signal using an inverter. That is, when one of the gates is at the high level, the other gate becomes the low level. Further, in a transfer switch using two P channel MOS transistors shown in FIG. 4G, also sources are made common, and the sources of the two P channel MOS transistors are made common as a common terminal of the transfer switch and each drain of the two P channel MOS transistors forms a make/break terminal, respectively. At this time, each gate of the two P channel MOS transistors is driven by an opposite phase signal using an inverter.

FIG. 4H shows a transfer switch using a circuit containing a combination of an N channel and a P channel. Drains of the N channel and the P channel commonly connected to each other are connected to one of two terminals on the side of transfer, and four sources of these transistors commonly connected to each other and form a common terminal. Gates of the N channel MOS transistor and the P channel MOS transistor not connected to each other are commonly connected to each other, and the commonly connected gates are driven by an opposite phase signal using an inverter. Operation of this transfer switch is fundamentally according to a combination of the make/break type switch described above, and then description of the operation will be omitted.

Further, a criterion for determining whether an N channel MOS transistor is used as a switch or a P channel MOS transistor is used, or whether a circuit of a combination of an N channel MOS transistor and a P channel MOS transistor is used, is a switch potential. For example, let VDD be a power voltage, when a voltage applied to the switch is approximately higher than VDD/2, the P channel MOS transistor will be used, and on the contrary, when the voltage applied to the switch is approximately lower than VDD/2, the N channel MOS transistor will be used, further when the switch has to operate in the entire input voltage range from VSS (GND) to VDD, the circuit containing a combination of the N channel MOS transistor and the P channel MOS transistor will be used.

In the examples in FIGS. 1 to 3, because S11 to S14 have to operate in the entire input voltage range from VSS (GND) to VDD, the type shown in FIG. 4H has to be used. Further, because S1 operates at a potential lower approximately by 1 to 2 V than the VDD voltage, the switch using the P channel MOS transistor is used. Further, the switch S2 operates at a potential higher approximately by 1 to 2 V than VSS (GND), the switch using the N channel MOS transistor is used.

Variation

Figure 7:
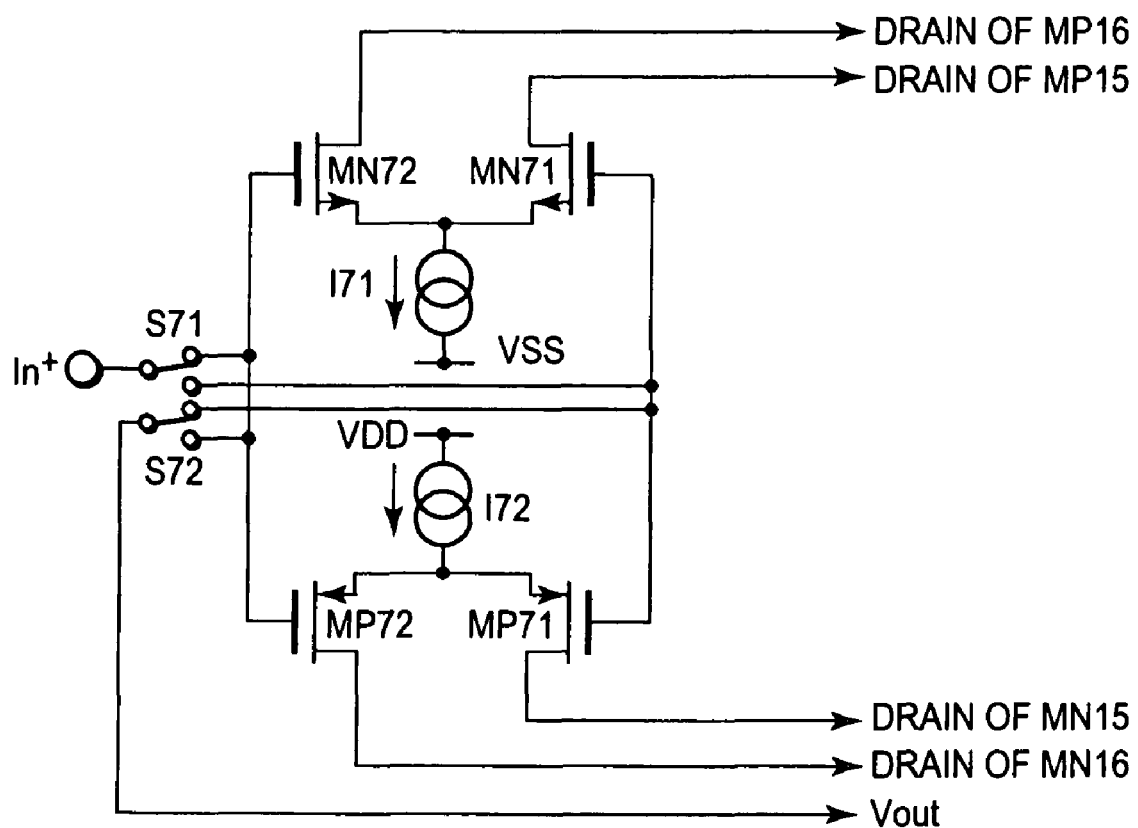
FIG. 7 is a view illustrating a variation of an input stage of the operational amplifier of the present invention.

FIG. 7 is a circuit diagram illustrating an input stage 71, when the input stage 11 in the present embodiments shown in FIGS. 1 to 3 is varied. The input stage 71 includes: an N channel differential pair INN71 composed of an N channel transistor; a P channel differential pair INP71 composed of a P channel transistor; and constant current sources 171, 172. The N channel differential pair INN71 has N channel MOS transistors MN71, MN72. The P channel differential pair INP71 has P channel MOS transistors MP71, MP72.

The N channel MOS transistors MN71, MN72 of the differential pair INN71 are connected to a noninverting input terminal In+ and an inverting input terminal. Further, the inverting input terminal is connected to an output terminal Vout and has a voltage of the output terminal fed back thereto. The P channel MOS transistors MP71, MP72 constituting the differential pair INP71 are connected to the noninverting input terminal In+ and the inverting input terminal.

A switch S71 has its common terminal connected to the input terminal In+. A make terminal of the switch S71 is connected to gates of the N channel MOS transistor MN71 and the P channel MOS transistor MP71, and a break terminal is connected to gates of the N channel MOS transistor MN72 and the P channel MOS transistor MP71.

A switch S72 has its common terminal connected to the output terminal Vout. A break terminal of the switch S72 is connected to the gates of the N channel MOS transistor MN71 and the P channel MOS transistor MP71, and a make terminal is connected to the gates of the N channel MOS transistor MN72 and the P channel MOS transistor MP72. That is, the switch S71 switches noninverting inputs of the two differential pairs of the N channel type and the P channel type, and the switch S72 switches inverting inputs of the two differential pairs.

The constant current source 171 is connected between sources of the N channel MOS transistors MN71, MN72 commonly connected and the negative power source VSS. The constant current source 172 is connected between sources of the P channel MOS transistors MP71, MP72 commonly connected and the positive power source VDD. Further, because a configuration of the circuit except the input stage is similar to that of the circuit described above in FIGS. 1 to 3, description thereof will be omitted.

Because of the configuration of the input stage as shown in FIG. 7, the number of switches used in total can be further decreased, resulting in a smaller circuit area.

The operational amplifier of the present embodiments of the present invention described above is suitable for an output amplifier of a LCD source driver, or an operational amplifier used for a grayscale voltage generation circuit for determining γ compensation. It is necessary for these operational amplifiers to include a circuit having a very small offset voltage and to have some offset cancellation function. For this purpose, in the present invention, a conventional circuit is resourcefully modified, providing a spatial offset cancellation circuit using a simple circuit configuration.

The operational amplifier of the present invention is used for an output amplifier of a source driver, or a grayscale voltage generation circuit for determining γ compensation in a liquid crystal display, and the switches are changed by a liquid crystal drive signal during one horizontal period, or one frame period. Accordingly, an offset voltage generated in the operational amplifier is spatially dispersed, and as the result, a human eye is made under an illusion, providing a beautiful display image visually without the offset voltage. If the offset voltage is present, a display defect such as a vertical line occurs, but with using the present invention, more uniform gradation can be provided.

Now, the description has been provided based on the present embodiments of the present invention, but the present invention is not limited to the embodiments described above, those skilled in the art may make various modifications thereto.

What is claimed is:

1. An operational amplifier, comprising:
   a first differential pair having a first transistor and a second transistor of a first conductivity type;
   a second differential pair having a third transistor and a fourth transistor of a second conductivity type;
   a first floating current source;
   a second floating current source; and
   an output stage having a fifth transistor and a sixth transistor, wherein
   when an input signal is applied to the first and third transistor, an electric current which flows into the fifth transistor and the sixth transistor is set by the first floating current source rather than the second floating current source, and
   when the input signal is applied to the second and fourth transistor, an electric current which flows into the fifth transistor and the sixth transistor is set by the second floating current source rather than the first floating current source.

2. The operational amplifier according to claim 1, wherein
   to the first floating current source, a first bias voltage or a second bias voltage is selectively supplied, and
   to the second floating current source, a third bias voltage or a fourth bias voltage is selectively supplied.

3. The operational amplifier according to claim 1, further comprising:

a first and second switch element for selectively connecting the first floating current source or the second floating current source to the output stage.

4. The operational amplifier according to claim 1, wherein the first floating current source includes a seventh transistor of the first conductivity type and an eighth transistor of the second conductivity type, a source of the seventh transistor is connected to a drain of the eighth transistor, and a drain of the seventh transistor is connected to a source of the eighth transistor.

5. The operational amplifier according to claim 4, wherein the second floating current source includes a ninth transistor of the first conductivity type and a tenth transistor of the second conductivity type, a source of the ninth transistor is connected to a drain of the tenth transistor, and a drain of the ninth transistor is connected to a source of the tenth transistor.

6. The operational amplifier according to claim 5, wherein the second floating current source includes an eleventh and twelfth transistor of the first conductivity type whose gates are commonly connected to each other, and a thirteenth and fourteenth transistor of the second conductivity type whose gates are commonly connected to each other, sources of the eleventh and thirteenth transistor are commonly connected to each other, and sources of the twelfth and fourteenth transistor are commonly connected to each other.

7. The operational amplifier according to claim 2, wherein selection of the first bias voltage or the second bias voltage supplied to the first floating current source and selection of the third bias voltage or the fourth bias voltage supplied to the second floating current source are determined by switching transistors responsive to the selection status of said input signal being applied either to said first transistor or to second transistor.

8. The operational amplifier according to claim 1, wherein the operational amplifier includes an active load portion connected to the first and second differential pairs, and the active load portion changes an active load element depending on the transistor to which the input signal is supplied.

9. A liquid crystal display driving method for driving a liquid crystal display using an operational amplifier having:

a first differential pair having a first transistor and a second transistor of a first conduction type;

a second differential pair having a third transistor and a fourth transistor of a second conduction type;

a first floating current source;

a second floating current source; and an output stage having a fifth transistor and a sixth transistor, comprising:

driving said liquid crystal display by said output stage with an electric current which flows into the fifth transistor and the sixth transistor being set by the first floating current source when an input signal is applied to the first and third transistor, driving said liquid crystal display by said output stage with an electric current which flows into the fifth transistor and the sixth transistor being set by the second floating current source when the input signal is applied to the second and fourth transistor.

* * * * *